United States Patent
Ruster

(10) Patent No.: US 11,921,142 B2
(45) Date of Patent: Mar. 5, 2024

(54) MEASUREMENT SYSTEM AND METHOD FOR ANALYZING RF SIGNALS

(71) Applicant: Rohde & Schwarz GmbH & Co. KG, Munich (DE)

(72) Inventor: Thomas Ruster, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/949,799

(22) Filed: Sep. 21, 2022

(65) Prior Publication Data

US 2023/0160938 A1    May 25, 2023

(30) Foreign Application Priority Data

Nov. 19, 2021   (EP) .................................... 21209167

(51) Int. Cl.
    *G01R 29/08*       (2006.01)
(52) U.S. Cl.
    CPC .................. G01R 29/0885 (2013.01)
(58) Field of Classification Search
    CPC ................................................ G01R 29/0885
    USPC ......................................................... 324/629
    See application file for complete search history.

(56) References Cited

U.S. PATENT DOCUMENTS

| 10,216,062 | B2* | 2/2019 | Kiffner | ................... G02F 1/353 |
| 2009/0074016 | A1* | 3/2009 | Marner | .............. G01N 21/3581 |
| | | | | 372/22 |
| 2018/0373118 | A1* | 12/2018 | Kiffner | ................. G02F 1/3536 |
| 2023/0126884 | A1* | 4/2023 | Ruster | .................... H01P 3/081 |
| | | | | 359/326 |

FOREIGN PATENT DOCUMENTS

EP        3394670 B1     2/2020

OTHER PUBLICATIONS

Cole, Z., and R. Krishna Mohan. "Optical frequency chirp generation by swept sideband injection locking." Journal of luminescence 107.1-4 (2004): 146-149. (Year: 2004).*

(Continued)

*Primary Examiner* — Christopher P Mcandrew
(74) *Attorney, Agent, or Firm* — DITTHAVONG, STEINER & MLOTKOWSKI

(57) ABSTRACT

Disclosed is a measurement system for analyzing RF signals, comprising an optically transparent enclosure including an optically pumpable medium being exposed to an electromagnetic field of the RF signal to be analyzed; an optical pump for penetrating the medium with intensity-modulated light, the intensity defining an absorption sensitivity of the medium; a field generator for generating an electric and/or magnetic field within the enclosure, a strength of the generated field defining an absorption frequency of the medium; a controller for controlling the absorption sensitivity of the medium in dependence of the absorption frequency of the medium; and a detector for detecting an optical property of the penetrating light passing through the medium. This facilitates fine-tunable and frequency-dependent control of sensitivity and dynamic range for spectral analysis of RF signals.

15 Claims, 3 Drawing Sheets

(56) References Cited

OTHER PUBLICATIONS

Anderson, D. A., E. G. Paradis, and G. Raithel. "A vapor-cell atomic sensor for radio-frequency field detection using a polarization-selective field enhancement resonator." Applied Physics Letters 113.7 (2018): 073501. (Year: 2018).*

Li, Youzhi, et al. "Broadband RF imaging and spectrum analysis using spatial-spectral hole burning in an inhomogeneously broadened absorber." Photonic Applications in Nonlinear Optics, Nanophotonics, and Microwave Photonics. vol. 5971. SPIE, 2005. (Year: 2005).*

Kunkee, Elizabeth T., et al. "Photonically enabled RF spectrum analyzer demonstration." Enabling Photonics Technologies for Defense, Security, and Aerospace Applications IV. vol. 6975. SPIE, 2008. (Year: 2008).*

* cited by examiner

MEASUREMENT SYSTEM AND METHOD FOR ANALYZING RF SIGNALS

TECHNICAL FIELD

The present disclosure relates to signal analysis in microwave communication, and in particular to a measurement system for analyzing radio frequency (RF) signals and a corresponding method.

BACKGROUND ART

Atom-based quantum effects may be used in developing quantum sensors for various physical quantities, as is known in the art.

For example, in highly excited energy states wherein an outermost electron is substantially farther away from a nucleus as in a ground energy state, atomic vapor may exhibit sensitive responses to external electromagnetic RF fields ranging from several to hundreds of gigahertz (GHz). This coincides with a microwave frequency range between 300 MHz and 300 GHz, respectively.

For spectrum analysis of RF signals, it is crucial that the underlying quantum sensor provides a fine-tunable and frequency-dependent control of sensitivity and dynamic range.

Conventionally, attenuators typically attenuate all frequency components, whereas filter banks can attenuate certain frequency ranges but have to be programmed in accordance with previously measured data.

SUMMARY

In view of the above-mentioned drawbacks and limitations, the present disclosure aims to improve an RF spectrum analysis of the background art. An objective is to provide systems and methods offering the above-mentioned fine-tunable and frequency-dependent control of sensitivity and dynamic range.

The objectives are achieved by the embodiments as defined by the appended independent claims. Preferred embodiments are set forth in the dependent claims and in the following description and drawings.

A first aspect of the present disclosure relates to a measurement system for analyzing RF signals, comprising: an optically transparent enclosure comprising an optically pumpable medium being exposed to an electromagnetic field of the RF signal to be analyzed; an optical pump for penetrating the medium with intensity-modulated light, wherein the intensity defines an absorption sensitivity of the medium; a field generator for generating an electric and/or magnetic field within the enclosure, wherein a strength of the generated field defines an absorption frequency of the medium; a controller for controlling the absorption sensitivity of the medium in dependence of the absorption frequency of the medium; and a detector for detecting an optical property of the penetrating light passing through the medium.

The optical pump may comprise one of: a directly modulated laser, and an externally modulated laser. The field generator may be configured to generate a homogeneous field within the enclosure. The controller may be configured to sweep the absorption frequency of the medium over a frequency range of the RF signal to be analyzed. The detector may comprise a photodiode.

The externally modulated laser may comprise an acousto-optic modulator.

The optical pump may comprise a spatially resolving light modulator. The field generator may be configured to generate a spatially resolved inhomogeneous field within the enclosure. The controller may be configured to spatially resolve the absorption sensitivity of the medium in accordance with the spatially resolved absorption frequency of the medium. The detector may comprise a camera.

The spatial resolution may be present in a lateral direction relative to a propagation direction of the light.

The spatially resolving light modulator may comprise a transmissive light valve.

The medium may comprise at least one constituent of: atoms, molecules or ions in a gas, and point defects in a solid.

The optical pump may comprise a coherent light source being resonant to at least one energy transition of the at least one constituent to an initial energy state.

The initial energy state may comprise a Rydberg state.

The gas may comprise an alkali metal.

The gas may comprise Rubidium.

The solid may comprise a diamond.

The optical pump may be configured to penetrate the medium in a continuous wave, CW, mode. The detector may be configured to continually detect the optical property of the penetrating light passing through the medium.

The optical property may comprise one of: an intensity, and a photon count.

A second aspect of the present disclosure relates to a method for analyzing RF signals, comprising generating an electric and/or magnetic field in an optically transparent enclosure comprising an optically pumpable medium being exposed to an electromagnetic field of the RF signal to be analyzed, wherein a strength of the generated field defines an absorption frequency of the medium; penetrating the medium with intensity-modulated light, wherein the intensity defines an absorption sensitivity of the medium; controlling the absorption sensitivity of the medium in dependence of the absorption frequency of the medium; and detecting an optical property of the penetrating light passing through the medium.

Advantageous Effects

The present disclosure provides systems and methods for spectrum analysis of RF signals based on an optically pumpable medium in an optically transparent enclosure, such as an atomic vapor cell, for example.

The constituents of the medium, which denote N-level quantum systems (N≥2), are optically pumped to an initial energy state. The initial energy state may optionally be only marginally short of the vacuum/ionic state, wherein an outermost electron is substantially farther away from the nucleus as in a ground state. Owing to their extraordinarily large dimension with respect to regular particles, the constituents of the medium are particularly sensitive to exposure to external electric and/or magnetic fields.

When exposing the constituents of the medium to a—static—magnetic and/or electric field generated within the enclosure, this resulting in splitting of the initial energy state to a plurality of initial energy states due to Zeeman or Stark splitting.

Zeeman splitting may refer to splitting of a spectral line into several components in the presence of a static magnetic field. Stark splitting, the electric-field analogue of Zeeman splitting, may refer to splitting of a spectral line into several components in the presence of a static electric field.

The constituents of the medium may easily be taken to even higher energy levels by absorption when exposed to external electro-magnetic RF fields. Such a (near) field may be induced around an electrical transmission line guiding an RF signal to be analyzed through the enclosure, radiated by an antenna, or simply be around (i.e., an ambient field).

An intensity of the light penetrating the medium (and thus pumping its constituents) defines a population of the initial energy state, and hence an absorption sensitivity of the medium. More specifically, a low laser intensity enables detection of low-power RF signals, whereas a high laser intensity reduces the sensitivity but increases a dynamic range. The key parameter here is the pumping rate. A low light intensity leads to a low pumping rate, which requires less RF power to cause a significant population change while the optical pump 12 is in operation.

A strength of the generated static electric and/or magnetic field determines an absorption frequency (or a plurality thereof) of the medium.

The intensity of the light and the strength of the field may be associated in that the absorption sensitivity of the medium depends on the absorption frequency of the medium. A spectral analysis of RF signals may thus enjoy fine-tunable and frequency-dependent control of sensitivity and dynamic range. That is, a better fine-tuning and less sensitivity loss are achieved.

The technical effects and advantages described above in relation with the measurement system for analyzing RF signals equally apply to the method for analyzing RF signals having corresponding features.

BRIEF DESCRIPTION OF DRAWINGS

The above-described aspects and implementations will now be explained with reference to the accompanying drawings, in which the same or similar reference numerals designate the same or similar elements.

The features of these aspects and implementations may be combined with each other unless specifically stated otherwise.

Figure 1:
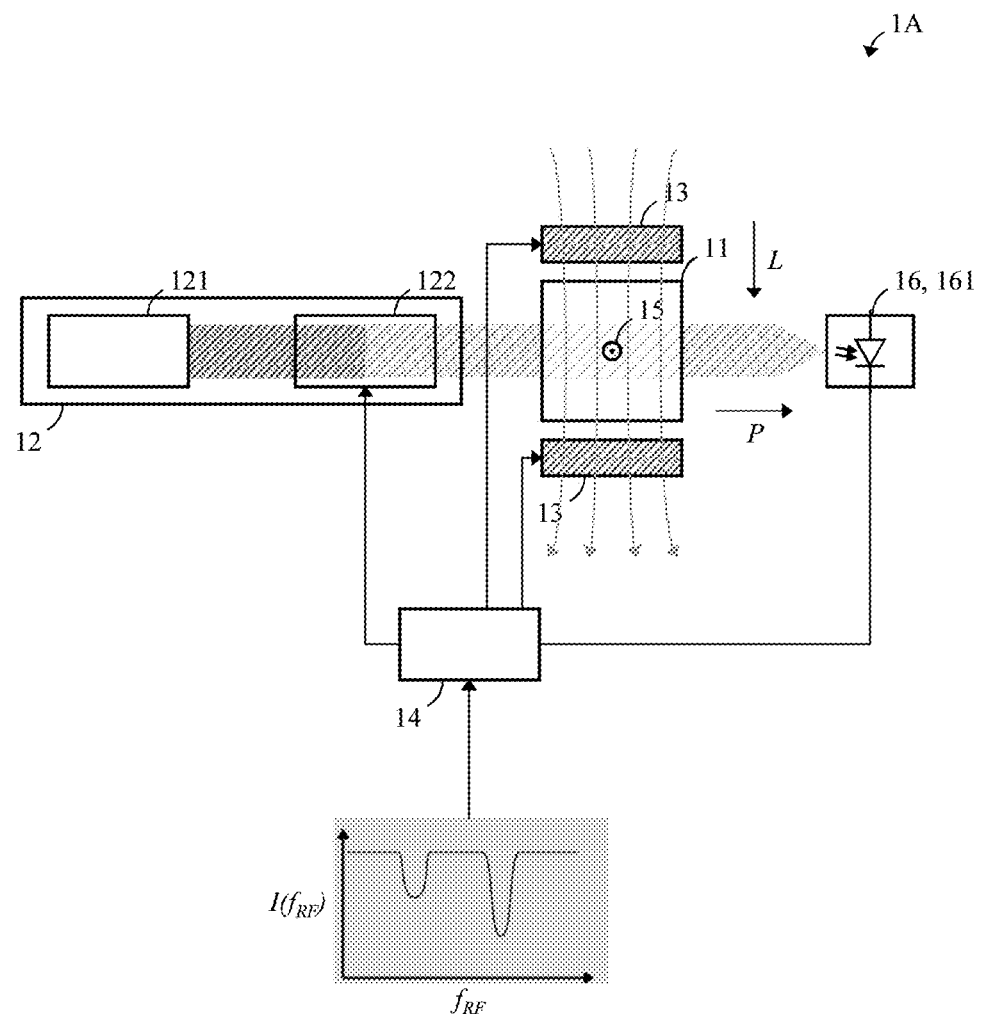

The drawings are to be regarded as being schematic representations, and elements illustrated in the drawings are not necessarily shown to scale. Rather, the various elements are represented such that their function and general purpose become apparent to those skilled in the art.

Figure 2:
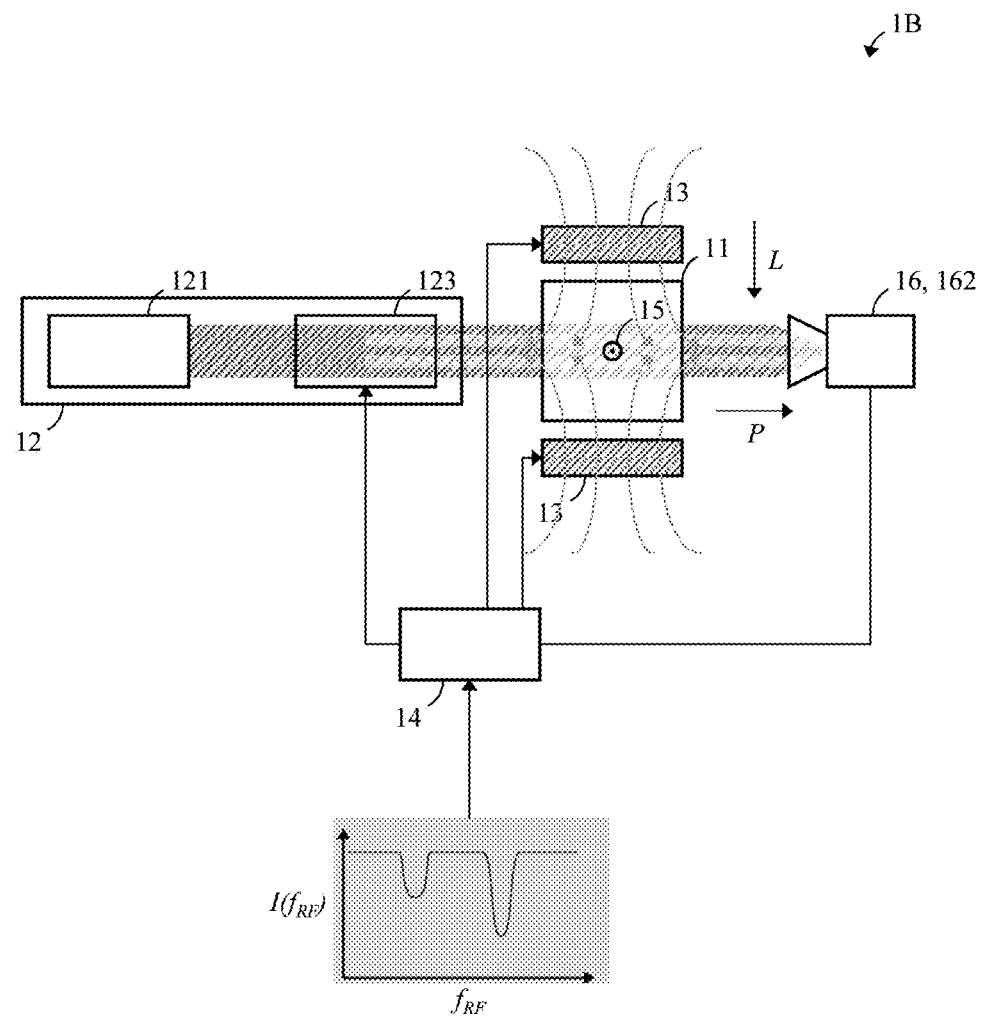
Figure 3:
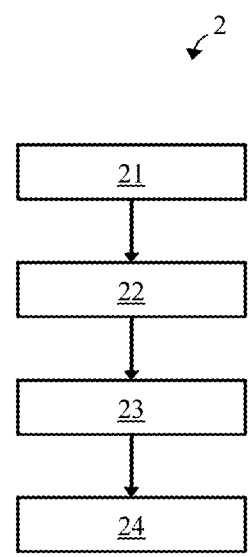

FIG. 1 illustrates a measurement system for analyzing RF signals in accordance with an implementation of the present disclosure;

FIG. 2 illustrates a measurement system for analyzing RF signals in accordance with a further implementation of the present disclosure; and FIG. 3 illustrates a flow chart of a method for analyzing RF signals in accordance with the present disclosure.

DETAILED DESCRIPTIONS OF DRAWINGS

FIG. 1 illustrates a measurement system 1A for analyzing RF signals in accordance with an implementation of the present disclosure.

The measurement system 1A, like the measurement system 1B explained below, comprises an optically transparent enclosure 11 (such as an atomic vapor cell, a.k.a. gas cell) comprising an optically pumpable medium that is exposed to an electromagnetic field of the RF signal to be analyzed. The medium may comprise at least one constituent of: atoms, molecules or ions in a gas, and point defects in a solid. The gas may comprise an alkali metal, in particular Rubidium (Rb), whereas the solid may comprise a diamond having nitrogen-vacancy (NV) point defects.

The measurement systems 1A, 1B further comprise an optical pump 12 for penetrating the medium with intensity-modulated light. Optical pumping may refer to a process of stimulating quantum systems having at least two energy levels/states, such as the aforementioned constituents of the medium, through resonant absorption of photons of adequate frequency. The intensity of the light defines an absorption sensitivity of the medium. In particular, the optical pump 12 may comprise a coherent light source 121 (such as a laser) being resonant to at least one energy transition of the at least one constituent to an initial energy state. The initial energy state may comprise a Rydberg state. Optionally, the measurement systems 1A, 1B may comprise further coherent light sources besides the optical pump 12.

The measurement systems 1A, 1B further comprise a field generator 13 for generating an electric and/or magnetic field within the enclosure 11. For example, the field generator 13 may include an electromagnet. A strength of the generated field defines an absorption frequency (or a number of absorption frequencies) $f_{RF}$ of the medium.

The measurement systems 1A, 1B further comprise a controller 14 for controlling the absorption sensitivity of the medium in dependence of the absorption frequency $f_{RF}$ of the medium. That is to say, the controller 14 is configured to sweep the absorption frequency $f_{RF}$ of the medium (via the strength of the electric and/or magnetic field generated by the field generator 13) and concurrently to control the absorption sensitivity of the medium (via the intensity of the light of the optical pump 12).

The measurement systems 1A, 1B may further comprise an electrical transmission line 15 for guiding the RF signal to be analyzed through the enclosure 11, thereby inducing the electromagnetic field of the RF signal to be analyzed. The transmission line 15 may comprise an electroconductive waveguide, such as a metallic wire. Alternatively, the measurement systems 1A, 1B may further comprise an antenna (not shown) radiating the electromagnetic field of the RF signal to be analyzed into the enclosure 11.

The measurement systems 1A, 1B further comprise a detector 16 for detecting an optical property of the penetrating light passing through the medium. Actually, the detection may capture emitted light as well: When the particles of the medium absorb the light of the optical pump 12, they also emit photons to all directions, which could be collected by a lens, for instance, and fed to the detector 16 as well.

The optical property may comprise one of: an intensity, and a photon count. Forming a difference (or ratio) of the respective optical property of the penetrating light before and after passing through the medium may yield a measure of absorption by the medium. The optical property may further comprise a phase change of the light upon passage through the medium.

The optical pump 12 may be configured to penetrate the medium in a continuous wave, CW, mode, and the detector 16 may be configured to continually detect the optical property of the penetrating light passing through the medium. In other words, the optical pump 12 and the RF signal to be analysed are preferably applied during the entire measurement.

The specific measurement system 1A depicted in FIG. 1 implements a sweep-based spectral analyzer.

More specifically, the field generator 13 may be configured to generate a homogeneous field within the enclosure 11, preferably directed in a lateral direction L relative to a propagation direction P of the light, which lacks a field gradient and thus a spatial resolution in the lateral direction L. Therefore, the detector 16 may comprise a photodiode 161 for punctiform detection. The generated homogeneous field results in a specific absorption frequency (or a number of specific absorption frequencies) $f_{RF}$ of the medium.

The optical pump 12 may comprise one of: a directly modulated laser (not shown), and an externally modulated laser 121, 122. Rydberg excitation usually requires a plurality of lasers, but in that case, it is sufficient to modulate one laser of the plurality.

A laser may refer to a device configured to emit light based on stimulated emission of electromagnetic radiation. For example, the externally modulated laser 121, 122 may comprise an acousto-optic modulator 122. An acousto-optic modulator may refer to a device configured to use the so-called acousto-optic effect (i.e., sound waves) to influence, inter alia, an intensity of incident light.

As the name suggests, the controller 14 of the sweep-based spectral analyzer may be configured to sweep the absorption frequency $f_{RF}$ of the medium over a frequency range of the RF signal to be analyzed, by varying a strength of the generated homogeneous field. As mentioned above, the absorption sensitivity of the medium may be controlled in dependence of the absorption frequency $f_{RF}$ of the medium, by adapting the intensity of the light penetrating the medium.

FIG. 1 shows an exemplary intensity profile $I(f_{RF})$ in dependence of the absorption frequency $f_{RF}$ of the medium, corresponding to a frequency-specific absorption sensitivity of the medium. The intensity profile $I(f_{RF})$ may be provided as user input to the controller 14.

FIG. 2 illustrates a measurement system 1B for analyzing RF signals in accordance with a further implementation of the present disclosure.

As mentioned above, the same or similar reference numerals as in FIG. 1 designate the same or similar elements.

The specific measurement system 1B depicted in FIG. 2 implements a field gradient-based spectral analyzer.

As such, the field generator 13 may be configured to generate a spatially resolved inhomogeneous field within the enclosure 11, wherein the generated field exposes a field gradient. For example, the field generator 13 may comprise an electromagnet whose magnetic field coils generate counter-directed fields. The field gradient ensures availability of constituents of the medium in a ground state for each frequency in a desired frequency range, such as an RF/microwave frequency range. The spatial resolution may be present in a lateral direction L relative to a propagation direction P of the light. Therefore, the detector 16 may comprise a spatially resolving camera 162, and the optical pump 12 may comprise a spatially resolving light modulator 123, such as a transmissive light valve. A transmissive light valve may refer to a device configured to attenuate components of light passing through the device in dependence of their lateral position relative to a propagation direction of the light (i.e., spatially resolved). The inhomogeneous field generated by the field generator 13 results in a spatially resolved absorption frequency $f_{RF}$ of the medium (i.e., a dependency of the absorption frequency $f_{RF}$ of a—preferably lateral—position within the enclosure 11.

Like its name suggests, the controller 14 of the field gradient-based spectral analyzer may be configured to spatially resolve the absorption sensitivity of the medium, by adapting the intensity of the light penetrating the medium in accordance with the spatially resolved absorption frequency $f_{RF}$ of the medium.

The intensity profile $I(f_{RF})$ introduced in FIG. 1 may be re-used as the user input to the controller 14.

FIG. 3 illustrates a flow chart of a method 2 for analyzing RF signals in accordance with the present disclosure.

The method 2 comprises a step of generating 21 an electric and/or magnetic field in an optically transparent enclosure 11 comprising an optically pumpable medium being exposed to an electromagnetic field of the RF signal to be analyzed, wherein a strength of the generated field defines an absorption frequency $f_{RF}$ of the medium.

The method 2 further comprises a step of penetrating 22 the medium with intensity-modulated light, wherein the intensity defines an absorption sensitivity of the medium.

The method 2 further comprises a step of controlling 23 the absorption sensitivity of the medium in dependence of the absorption frequency $f_{RF}$ of the medium.

The method 2 further comprises a step of detecting 24 an optical property of the penetrating light passing through the medium.

The invention claimed is:

1. A measurement system for analyzing RF signals, comprising
    an optically transparent enclosure comprising an optically pumpable medium being exposed to an electromagnetic field of the RF signal to be analyzed;
    an optical pump for penetrating the medium with intensity-modulated light, the intensity defining an absorption sensitivity of the medium;
    a field generator for generating an electric and/or magnetic field within the enclosure, a strength of the generated field defining an absorption frequency of the medium;
    a controller for controlling the absorption sensitivity of the medium in dependence of the absorption frequency of the medium; and
    a detector for detecting an optical property of the penetrating light passing through the medium.

2. The measurement system of claim 1,
    the optical pump comprising one of: a directly modulated laser, and an externally modulated laser;
    the field generator being configured to generate a homogeneous field within the enclosure;
    the controller being configured to sweep the absorption frequency of the medium over a frequency range of the RF signal to be analyzed; and
    the detector comprising a photodiode.

3. The measurement system of claim 2,
    the externally modulated laser comprising an acousto-optic modulator.

4. The measurement system of claim 1,
    the optical pump comprising a spatially resolving light modulator; and
    the field generator being configured to generate a spatially resolved inhomogeneous field within the enclosure;
    the controller being configured to spatially resolve the absorption sensitivity of the medium in accordance with the spatially resolved absorption frequency of the medium; and
    the detector comprising a camera.

5. The measurement system of claim 4,
    the spatial resolution being present in a lateral direction relative to a propagation direction of the light.

6. The measurement system of claim 4,
    the spatially resolving light modulator comprising a transmissive light valve.

7. The measurement system of claim 1,
the medium comprising at least one constituent of: atoms, molecules or ions in a gas, and or point defects in a solid.

8. The measurement system of claim 7,
the optical pump comprising a coherent light source being resonant to at least one energy transition of the at least one constituent to an initial energy state.

9. The measurement system of claim 8,
the initial energy state comprising a Rydberg state.

10. The measurement system of claim 7,
the gas comprising an alkali metal.

11. The measurement system of claim 10,
the gas comprising Rubidium.

12. The measurement system of claim 7,
the solid comprising a diamond.

13. The measurement system of claim 1,
the optical pump being configured to penetrate the medium in a continuous wave, CW, mode; and
the detector being configured to continually detect the optical property of the penetrating light passing through the medium.

14. The measurement system of claim 13,
the optical property comprising one of: an intensity, and a photon count.

15. A method for analyzing RF signals, comprising generating an electric and/or magnetic field in an optically transparent enclosure comprising an optically pumpable medium being exposed to an electromagnetic field of the RF signal to be analyzed, a strength of the generated field defining an absorption frequency of the medium;

penetrating the medium with intensity-modulated light, the intensity defining an absorption sensitivity of the medium;

controlling the absorption sensitivity of the medium in dependence of the absorption frequency of the medium; and detecting an optical property of the penetrating light passing through the medium.

* * * * *